United States Patent [19]

Ueno

[11] Patent Number: 4,845,386

[45] Date of Patent: Jul. 4, 1989

[54] BI-MOS LOGIC CIRCUIT HAVING A TOTEM POLE TYPE OUTPUT BUFFER SECTION

[75] Inventor: Masaji Ueno, Yokohama, Japan

[73] Assignee: Kabushiki Kaisha Toshiba, Kawasaki, Japan

[21] Appl. No.: 151,231

[22] Filed: Feb. 1, 1988

[30] Foreign Application Priority Data

Feb. 6, 1987 [JP] Japan .................................. 62-25725

[51] Int. Cl.$^4$ ............................................. H03K 19/01
[52] U.S. Cl. ................................... 307/446; 307/443; 307/451; 307/570
[58] Field of Search ............... 307/443, 446, 451, 456, 307/475, 570

[56] References Cited

U.S. PATENT DOCUMENTS

| | | | |
|---|---|---|---|
| 3,879,619 | 4/1975 | Pleshko | 307/570 |
| 4,649,294 | 3/1987 | McLaughlin | 307/443 X |
| 4,661,723 | 4/1987 | Masuda et al. | 307/570 X |
| 4,678,940 | 7/1987 | Vasseghi et al. | 307/570 X |
| 4,678,943 | 7/1987 | Uragami et al. | 307/443 X |
| 4,697,103 | 9/1987 | Ferris et al. | 307/456 |
| 4,733,110 | 3/1988 | Hara et al. | 307/443 X |

FOREIGN PATENT DOCUMENTS 0149426  8/1984  Japan .................................. 307/446

OTHER PUBLICATIONS

Lin et al., "Complementary MOS-Bipolar Transistor Structure", IEEE T.E.L.D., vol. ED-16, No. 11, Nov. 1969, pp. 945-951.

Primary Examiner—David Hudspeth
Attorney, Agent, or Firm—Finnegan, Henderson, Farabow, Garrett, & Dunner

[57] ABSTRACT

A totem pole type output buffer section comprises a pull-up NPN bipolar transistor and a pull-down NPN bipolar transistor. These NPN bipolar transistors are selectively switch-controlled by a first MOS FET. Another NPN bipolar transistor is darlington-connected to the pull-down NPN bipolar transistor, and is switch-controlled by the second MOS FET. The second MOS FET is of the same conductivity type as and has a gate connected to a gate of the first MOS FET.

6 Claims, 2 Drawing Sheets

BI-MOS LOGIC CIRCUIT HAVING A TOTEM POLE TYPE OUTPUT BUFFER SECTION

BACKGROUND OF THE INVENTION

The present invention relates to a Bi-MOS logic circuit consisting of bipolar transistors and MOS FETs which are integratedly formed on the same substrate and, more particularly, to a Bi-MOS logic circuit which is used as a semiconductor logic circuit for operating a circuit having a large output load, such as an LSI memory.

The characteristic feature of a Bi-MOS logic circuit is that it has a totem pole type output buffer section which consists of two NPN bipolar transistors and is switch-controlled by a MOS circuit.

FIG. 1 shows an example of a Bi-MOS logic circuit in which the MOS circuit has a CMOS structure. This logic circuit is a well-known Bi-CMOS buffer circuit which generates an output signal having the same phase as the input signal.

The totem pole type output buffer section of this logic circuit includes pull-up NPN bipolar transistor Q5 and pull-down Schottky type NPN bipolar transistor Q6, as well as Schottky NPN bipolar transistor Q7 which is darlington-connected to transistor Q5 in order to allow the level of an output signal supplied by output terminal T2 to rise quickly.

Schottky diodes D1 and D2, on the other hand, are provided to enable the level of an output signal from terminal T2 to fall quickly.

When the input signal supplied to input terminal T1 changes from the "0" level to the "1" level, P-type MOS FET Q1 is turned off and N-type MOS FET Q2 is turned on. Thus, the potential which is supplied to a gate of N-type MOS FET Q3 is set to the "0" level and FET Q3 is turned off. As a result, the base current is supplied from power source potential Vcc to transistor Q7 via resistor R1, and transistor Q7 is turned on, as is also pull-up transistor Q5. On the other hand, no base current is supplied to pull-down transistor Q6, with the result that it is turned off. Thus, a current flows from power source potential Vcc to output terminal T2 via resistor R4 and transistor Q5, thereby setting the potential of output terminal T2 from the "0" level to the "1" level. Since transistor Q7 is darlington connected to pull-up transistor Q5, the potential change at terminal T2 occurs at a higher speed than that in the case where transistor Q7 is not used.

When the input signal level changes from "1" to "0", FET Q1 is turned on and FET Q2 is turned off, so that the potential which is supplied to the gate of FET Q3 is set to the "1" level and FET Q3 is turned on. As a result, current is supplied from power source potential Vcc to the base of pull-down transistor Q6 via resistor R1 and FET Q3. Current is also supplied from the base of transistor Q5 to the base of transistor Q6, via Schottky diode D1 and FET Q3, and is also supplied to the base of transistor Q6 from output terminal T2, via diode D2 and FET Q3. Thus, transistor Q6 is turned on. Since, at this time, no current is supplied to pull-up transistor Q5, transistor Q5 remains in the OFF state, with the result that the potential of output terminal T2, i.e., the output voltage level, changes from "1" to "0". Since the base current which is supplied to pull-down transistor Q6 is increased by the current supplied via Schottky diodes D1 and D2, the potential change at terminal T2 occurs at a higher speed than in the case where no current flows through diodes D1 and D2.

Waveform shaping circuit section 11 comprising resistors R2 and R3 and Schottky type NPN bipolar transistors Q4 is used to make constant a collector current of pull-down transistor Q6 by transistor Q4 which operates as a diode and to shape the waveform which trails from the "1" level to the "0" level.

However, when a Bi-CMOS buffer circuit is constituted as above, the following parasitic capacitances (C1, C2, C3, C4, C5) are added to the base of transistor Q7: namely, the parasitic capacitance (C1) between the drain of FET Q3 and the substrate; the parasitic capacitances (C2 and C3) between the collector and the base of transistor Q7 and between the base and the emitter thereof; and the parasitic capacitances (C4 and C5) formed between cathode of diodes D1 or D2 and the substrate.

When FET Q3 is turned off, a delay is caused in the potential increase at the base of transistor Q7 by a time constant which is determined by resistor R1 and parasitic capacitances C1 to C5. Consequently, the leading propagation delay time ($t_{PLH}$) until an output signal rises to a predetermined level after the input signal supplied has reached a predetermined level is prolonged because of the parasitic capacitances $C_4$ and $C_5$.

SUMMARY OF THE INVENTION

It is an object of the present invention to provide a Bi-MOS logic circuit in which the response speed to an input signal is improved.

According to the invention, there is provided a Bi-MOS logic circuit comprising: first and second NPN bipolar transistors in which current paths between collectors and emitters are serially connected across power source terminals and the series connecting point is connected to an output terminal; a first MOS FET for selectively switch-controlling the first and second NPN bipolar transistors, in response to an input signal; a third NPN bipolar transistor having a collector to emitter path connected between the output terminal and a base of the second NPN bipolar transistor; and a second MOS FET, of the same conductivity type as that of the first MOS FET, one end of the second MOS FET being connected to the output terminal and the other end being connected to a base of the third NPN bipolar transistor, and a gate being connected to a gate of the first MOS FET.

According to this Bi-MOS logic circuit, in addition to being supplied with a current from the power source via the first MOS FET, the base of the pull-down NPN transistor of the Bi-MOS circuit of the present invention is also supplied with a current from the output terminal via the second MOS FET and the third NPN bipolar transistor.

Moreover, the parasitic capacitances existing in the second MOS FET and the third bipolar transistor, would not disturb a base current which must be supplied to the first bipolar transistor.

Thus, in the Bi-MOS logic circuit, the output signal can trail quietly without exerting an influence on the leading propagation delay time.

DETAILED DESCRIPTION OF THE PREFERRED EMBODIMENTS

A Bi-CMOS buffer circuit according to an embodiment of the present invention will now be described, with reference to FIG. 2.

Figure 2:
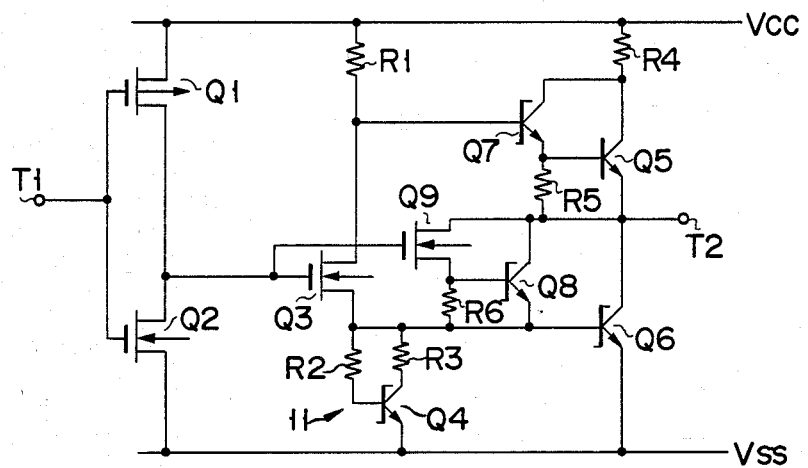
FIG. 2 is a diagram showing a Bi-MOS logic circuit according to an embodiment of the present invention.

Referring to FIG. 2, input terminal T1, to which input signal Vin is supplied, is connected to an input terminal of an inverter comprising a P type MOS FET Q1 and an N type MOS FET Q2 which are serially connected between power source potential Vcc and earth potential Vss. A node of FETs Q1 and Q2 is connected, as an output terminal of the inverter, to a gate of N type MOS FET Q3. Power source potential Vcc is connected to a drain of FET Q3 via resistor R1, and earth potential Vss is connected to a source of FET Q3 via waveform-shaping circuit section 11 which comprises resistors R2 and R3 and Schottky type NPN bipolar transistor Q4.

A totem pole type output buffer section comprising pull-up NPN bipolar transistor Q5 and pull-down Schottky type NPN bipolar transistor Q6 is provided at the output stage of the Bi-CMOS buffer circuit. A collector of transistor Q5 is connected to power source potential Vcc via resistor R4. An emitter of transistor Q5 is connected to a collector of transistor Q6, and an emitter of transistor Q6 is connected to earth potential Vss. Output terminal T2 is connected to the node of transistors Q5 and Q6.

Schottky type NPN bipolar transistor Q7, the base of which is connected to the node of resistor R1 and FET Q3, is darlington-connected to pull-up transistor Q5. In other words, the collectors of transistors Q5 and Q7 are commonly connected. The emitter of transistor Q7 is connected to the base of transistor Q5, resistor R5 is connected between the base and the emitter thereof, and the source of FET Q3 is connected to the base of pull-down NPN bipolar transistor Q6.

The Bi-CMOS buffer circuit is further provided with Schottky type NPN bipolar transistor Q8, which is darlington-connected to transistor Q6, in order to give it a high operating speed, and with N type MOS FET Q9 to switch-control transistor Q8.

The gate of N type MOS FET Q9 is commonly connected to the gate of N type MOS FET Q3, its drain is connected to output terminal T2, and its source is connected to the base of transistor Q8.

As has been stated above, transistor Q8 is darlington-connected to transistor Q6, that is, the collector of transistor Q8 is connected to output terminal T2 and its emitter is connected to the base of transistor Q6. Resistor R6, on the other hand, is connected between the base and the emitter of transistor Q8. The function of resistor R6 is to pull out a base current of transistor Q8.

The function of waveform shaping circuit section 11, comprising resistors R2 and R3 and Schottky type NPN bipolar transistor Q4, is to make constant the collector current of pull-down transistor Q6, through transistor Q4 operating as a diode, and to shape the waveform which trails from the "1" level to the "0" level.

The operation of the Bi-CMOS buffer circuit as constituted above will now be described in detail.

When the input signal which is supplied to input terminal T1 changes from the "0" level to the "1" level, FET Q1 is turned off and FET Q2 is turned on, so that the potential which is supplied to the gate of FET Q3 is set to the "0" level and both FET Q3 and FET Q9 are turned off. Thus, a base current is supplied from power source potential Vcc to transistor Q7 via resistor R1, turning transistor Q7 on, and also, therefore, pull-up transistor Q5. On the other hand, since no base current is supplied to pull-down transistor Q6, transistor Q6 remains off. As a result, a current flows from power source potential Vcc to output terminal T2, via resistor R4 and transistor Q5, changing the potential, i.e., the output voltage, of output terminal T2 from the "0" level to the "1" level. Since transistor Q7 is darlington-connected to pull-up transistor Q5, the transition from level "0" to "1" occurs much faster than in the case where the current flows only through pull-up transistor Q5.

When the level of the input signal changes from "1" to "0", FET Q1 is turned on and FET Q2 is turned off, so that the potential which is supplied to the gate of FET Q3 is set to the "1" level and FET Q3 is turned on. As a result, a current is supplied from power source potential Vcc to the base of pull-down transistor Q6 via resistor R1 and FET Q3. However, since FET Q9 is also turned on, a base current is then supplied to transistor Q8, turning it on, with the result that a base current is also supplied from output terminal T2 to pull-down transistor Q6, via transistor Q8, turning transistor Q6 on.

Since, at this time, no base current is supplied to pull-up transistor Q5, transistor Q5 remains OFF. Consequently, the potential of output terminal T2 is pulled out to the side of earth potential Vss and changes from the "1" level to the "0" level. Since the base current flowing into transistor Q6 increases by only the amount of the collector current of bipolar transistor Q8, the transition from level "1" to level "0" occurs much more quickly than in the case where the current path passing through transistor Q8 does not exist.

As has been explained above, by darlington-connecting transistor Q7 to pull-up transistor Q5, the leading transition of the output signal is made early. On the other hand, in addition to the base current which is supplied through FET Q3, a base current is also supplied to bipolar transistor Q6 from bipolar transistor Q8 which is made conductive by FET Q9, thereby also making the trailing transition early. Further, since the parasitic capacitances of FET Q9 and bipolar transistor Q8, which are provided to make the trailing transition of the output signal early, are not added to the base current supply path to bipolar transistor Q7, FET Q9 and transistor Q8 do not exert an influence on the leading propagation delay time of the output signal to the input signal.

Figure 1:
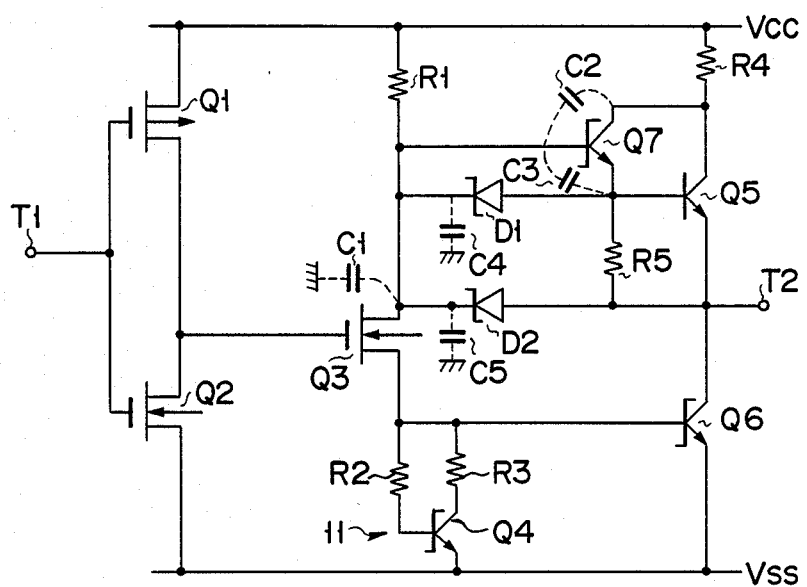
FIG. 1 is a circuit diagram showing a conventional Bi-MOS logic circuit.
Figure 3:
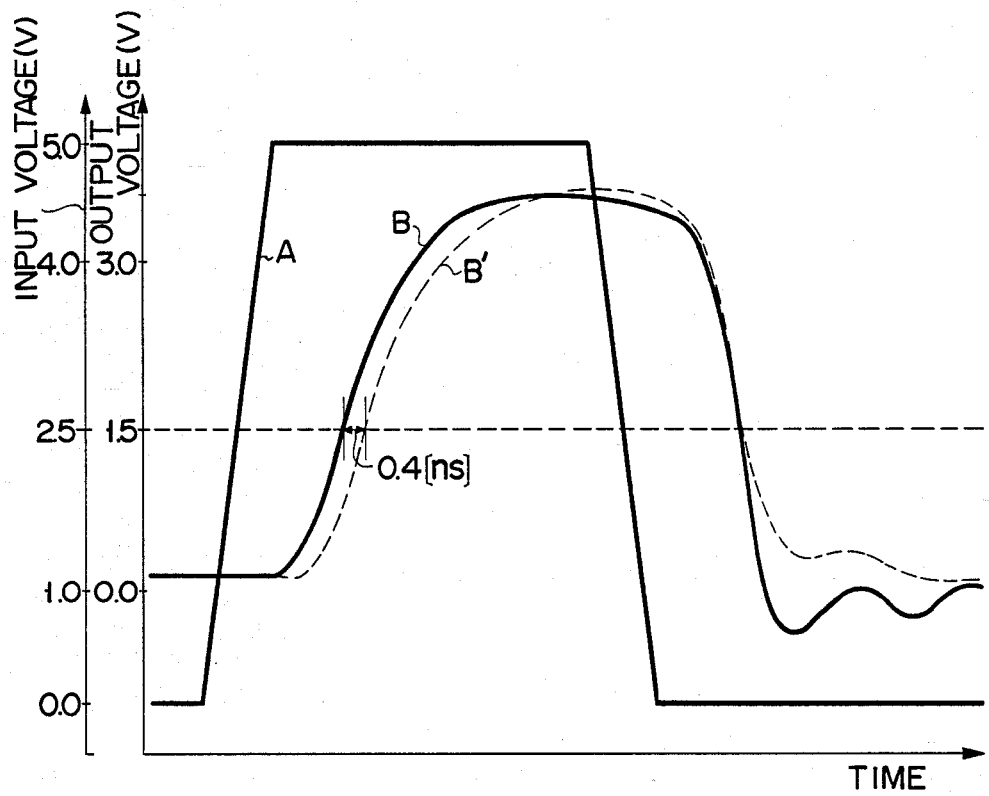
FIG. 3 is a comparison diagram showing the input-/output characteristics of the Bi-MOS logic circuit shown in FIG. 2 and of the conventional Bi-MOS logic circuit shown in FIG. 1.

FIG. 3 shows the results of the simulations of the output characteristics of the Bi-CMOS buffer circuit shown in FIG. 1. In this diagram, waveform A represents an input signal at the CMOS level which is supplied to input terminal T1; waveform B represents an output signal at the TTL level which is output from output terminal T2; and waveform B' represents an output signal of the conventional circuit shown in FIG. 1.

As has been described above, according to the Bi-CMOS buffer circuit of the invention, leading propagation delay time $t_{PLH}$, i.e. the time until the output signal rises to a predetermined level after the input signal was supplied to input terminal, can be improved by the time of about 0.4 (nsec) as compared with the conventional one. On the other hand, trailing propagation delay time $t_{PHL}$, i.e. the time until the output signal falls to a predetermined level after the input signal has been supplied to input terminal, is similar to that in the case of the conventional circuit.

Looking at FIG. 3, it can be seen that a ringing occurs at the trailing edge of the output signal from terminal T2 the present invention. This ringing can, however be easily eliminated by, for example, forwardly connecting a diode between the collector of transistor Q8 and output terminal T2.

Figure 4:
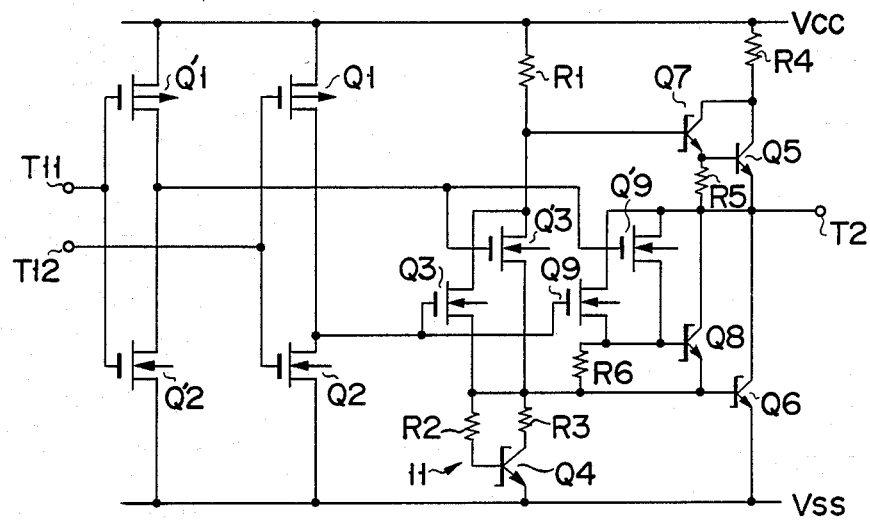
FIG. 4 is a diagram showing a Bi-MOS logic circuit according to another embodiment of the invention.

FIG. 4 shows a Bi-CMOS two-input AND gate according to another embodiment of the present invention.

When the input signal of the "1" level is supplied to each of input terminals T11 and T12 of this circuit, the output of an inverter consisting of a P type MOS FET Q1 and an N type MOS FET Q2 and that of an inverter consisting of a P type MOS FET Q1' and an N type MOS FET Q2' are both set to the "0" level. Thus, FET Q3 and FET Q3' are turned off and a base current is supplied to Schottky type NPN bipolar transistor Q7. As a result, NPN bipolar transistor Q5 is turned on and the potential of output terminal T2 is set to the "1" level.

When the input signal of the "0" level is supplied to at least one of input terminals T11 and T12, one or both of FET Q3 and FET Q3' are turned on—as, too, are one or both of FET Q9 and FET Q9'—and a base current is supplied to Schottky type NPN bipolar transistor Q8. As a result, transistor Q6 is turned on and the potential of output terminal T2 is set to the "0" level.

Thus, this circuit operates as an AND circuit. In this case, in a manner similar to the foregoing Bi-CMOS buffer circuit, leading propagation delay time $t_{PLH}$ of the output signal to the input signal can be also improved.

Although only those embodiments have been described in which the buffer circuit and two-input AND gate are constituted, another logic circuit such as, for example, an OR gate or the like can be also similarly constituted.

What is claimed is:

1. A Bi-MOS logic circuit comprising:
   first and second NPN bipolar transistors in which current paths between collectors and emitters are serially connected across power source terminals, and the series-connecting point is connected to an output terminal;
   a first MOS FET for selectively switching-on said first and second NPN bipolar transistors in response to an input signal, said first MOS FET being coupled to the base of said first NPN bipolar transistor, to the base of said second NPN bipolar transistor, and to receive said input signal;
   a third NPN bipolar transistor having a collector to emitter path connected between said output terminal and the base of said second NPN bipolar transistor; and
   a second MOS FET of the same conductivity type as that of said first MOS FET, one end of said second MOS FET being connected to said output terminal, the other end being connected to a base of said third NPN bipolar transistor, and a gate being connected to a gate of said first two MOS FET.

2. A Bi-MOS logic circuit according to claim 1, wherein a fourth NPN bipolar transistor in darlington-connected to said first NPN bipolar transistor, and said fourth NPN bipolar transistor is selectively switched on by the first MOS FET.

3. A Bi-MOS logic circuit according to claim 1, wherein said Bi-MOS logic circuit is a Bi-CMOS buffer circuit, a CMOS inverter circuit is provided at an input stage of said Bi-CMOS buffer circuit, and an output of said CMOS inverter circuit is supplied to a gate of said first MOS FET.

4. A Bi-MOS logic circuit according to claim 1, wherein said second and third NPN bipolar transistors are Schottky type NPN bipolar transistors, respectively.

5. A Bi-MOS logic circuit according to claim 1, wherein said first and second MOS FETs are N channel type MOS FETs, respectively.

6. A Bi-MOS logic circuit according to claim 2, wherein said fourth NPN bipolar transistor is a Schottky type NPN bipolar transistor.

* * * * *